United States Patent [19]

Miracky

[11] Patent Number: 5,077,100

[45] Date of Patent: Dec. 31, 1991

[54] METHOD FOR FORMING ELECTRICAL CONNECTIONS BETWEEN COPPER CONDUCTORS

[75] Inventor: Robert F. Miracky, Cedar Park, Tex.

[73] Assignee: Microelectronics and Computer Technology Corporation, Austin, Tex.

[21] Appl. No.: 422,939

[22] Filed: Oct. 17, 1989

[51] Int. Cl.[5] .......................... B05D 3/06; B05D 5/12; C23C 16/00

[52] U.S. Cl. .................................. 427/53.1; 427/99; 427/124; 427/252; 427/253; 204/106

[58] Field of Search .................... 427/53.1, 96, 97, 98, 427/99, 123, 124, 250, 252, 253, 255.1, 327, 328, 305, 304; 204/106

[56] References Cited

U.S. PATENT DOCUMENTS

| | | | |
|---|---|---|---|
| 3,897,223 | 7/1975 | Purdy et al. | 29/195 |
| 3,898,054 | 8/1975 | Purdy et al. | 29/198 |
| 3,941,971 | 3/1976 | James, Jr. | 219/85 |
| 4,430,124 | 2/1984 | Kato | 75/248 |
| 4,517,225 | 5/1985 | Broadbent | 427/96 |
| 4,699,801 | 10/1987 | Ito et al. | 427/53.1 |
| 4,736,883 | 4/1988 | Morgan et al. | 228/194 |
| 4,756,927 | 7/1988 | Black et al. | 427/252 |
| 4,830,891 | 5/1989 | Nishitani et al. | 427/253 |
| 4,873,413 | 10/1989 | Uesugi et al. | 427/53.1 |
| 4,938,996 | 7/1990 | Ziv et al. | 427/53.1 |
| 4,957,775 | 9/1990 | Black et al. | 427/53.1 |

OTHER PUBLICATIONS

Miracky, "The Application of Selective-Area Tungsten Layer CVD to Copper-On-Polyimide Multi-Chip Interconnection Modules", Materials Research Society, Mar. 1989, pp. 299–305.

Jensen et al, "Copper/Polyimide Materials System for High Performance Packaging", IEEE Transactions on Components, Hybrids, and Manufacturing Technology, Dec. 1984, vol. CHMT-7, No. 4, pp. 384–393.

Levinstein et al, "Multi-Chip Packaging Technology for VLSI-Based Systems", IEEE International Solid-State Circuits Conference, 1987, pp. 224–225.

Pan et al, "A Planar Approach to High Density Copper-Polyimide Interconnect Fabrication", Eighth Annual International Electronics Packaging Conference (Dallas, Tex.), Nov. 1988, pp. 174–189.

Houle et al, "Laser Chemical Vapor Deposition of Copper", Applied Physics Letters, Jan. 1985, vol. 46(2), pp. 204–206.

Bezuk et al., "Pyrolytic Laser Direct Writing of Nickel Over Polyimides", Materials Research Society Proceedings, 1987, vol. 75, pp. 75–81.

Bernhardt et al, "Laser Microfabrication Technology and Its Application to High Speed Interconnect of Gate Arrays", Material Research Society Symposium Proceedings, 1987, vol. 75, pp. 633–644.

Johnson et al, "Laser-Chemical Deposition and Etching on the Metallization Level of Integrated Circuits", Materials Research Society Symposium Proceedings, 1987, vol. 75, pp. 645–649.

Black et al, "GaAs Circuit Restructuring by Multilevel Laser-Direct Written Tungsten Process", Materials Research Society Symposium Proceedings, 1987, vol. 75, pp. 651–655.

(List continued on next page.)

*Primary Examiner*—Shrive Beck
*Assistant Examiner*—Marianne L. Padgett
*Attorney, Agent, or Firm*—David M. Sigmond

[57] ABSTRACT

A method for forming connections between copper conductors disposed on a substrate includes the steps of coating the copper conductors with a layer of nickel, exposing the coated copper conductors to a gas which includes a tungsten-bearing compound, and irradiating the substrate with a laser beam to deposit the tungsten between the copper conductors. A system for forming connections between copper conductors disposed on a substrate, includes means for coating the copper conductors with a layer of nickel, means for exposing the coated copper conductors to a gas which includes a tungsten-bearing compound, and means for irradiating the substrate with a laser beam to deposit the tungsten between the copper conductors.

26 Claims, 1 Drawing Sheet

OTHER PUBLICATIONS

Pattee et al, "Polyimide Film Properties and Selective LPCVD of Tungsten on Polyimide", Journal of the Electrochemical Society, Jun. 1988, vol. 135, No. 6, pp. 1477-1483.

Grossman et al, "Localized Laser Chemical Processing of Tungsten Films", Journal of Vacuum Science Technology, Jul./Aug. 1989, vol. B 5(4), pp. 843-847.

Hansen et al, "Constitution of Binary Alloys", 1958, (New York: McGraw Hill 2nd ed.), pp. 601-603, 649, 1057-1059.

Lee et al, "Microstructural Changes in Tungsten-Copper and Tungsten-Copper-Nickel Compacts During Heating Up for Liquid Phase Sintering", Modern Developments in Powder Metallurgy, 1985, vol. 15, pp. 489-506.

Lee et al., "Effect of Tungsten Particle Size on Infiltration Process and Microstructure in Nickel Doped Tungsten-Copper Electric Contacts", Horizontal Powder Metallurgy, Proceedings International, Powder Metallurgy Conference Exhibit, 1986, vol. 2, pp. 1115-1118.

Nagasaka et al, "The Connection of a Copper Conductor with a Tungsten Conductor on an Alumina Multilayer Substrate", IMC 1986 Proceeding Kobe, May 1986, pp. 255-261.

Kamijima et al, "Tungsten Coatings on Iron, Nickel, Copper, and Stainless Steel Obtained by CVD Method", Journal of the Metal Finishing Society of Japan, 1988, (in Japanese), vol. 39, No. 6, pp. 315-322.

METHOD FOR FORMING ELECTRICAL CONNECTIONS BETWEEN COPPER CONDUCTORS

BACKGROUND OF THE INVENTION

1. Field of the Invention

The present invention relates to thin film metallization and laser beam stimulated chemical processing and, more particularly, to thin film metallization for the interconnection of circuitry and laser beam stimulated chemical processing for microelectronic circuit fabrication.

2. Description of Related Art

There exists a need for a capability for making selective connections between the individual conductors on individual microelectronic circuit chips and on multichip modules. Laser beam stimulated processes can be employed to form these connections. An attractive candidate material for forming such electrically conductive links is tungsten metal because there are well established laser CVD processes by which it can be deposited. Details regarding several of these processes are set forth in A. W. Johnson and K. E. Greenberg, in "Laser-Chemical Deposition and Etching on the Metallization Level of Integrated Circuits", edited by V. Donnelly, I. Herman, and M. Hirose, Mater. Res. Soc. Proc. 75, pittsburgh, PA, pp. 645-649 (1987) and J. G. Black, S. P. Doran, M. Rothschild, J. H. C. Sedlacek, and D. J. Ehrlich, in "GaAs Circuit Restructuring by Multilevel Laser-Direct Written Tungsten Process", edited by V. Donnelly, I. Herman, and M. Hirose, Mater. Res. Soc. Proc. 75, Pittsburgh, PA, pp. 651-655 (1987), both of which articles are hereby incorporated by reference.

It is important to note that these two articles describe research in which gold, aluminum and/or polycrystalline silicon were intra-chip metals to be contacted. For inter-chip interconnects, on the other hand, most persons skilled in the art prefer copper because it has a relatively high conductivity (compared to, e.g., aluminum and poly-silicon) and because it is relatively inexpensive (compared to, e.g., gold).

The tungsten laser CVD processes described in the two articles cited above are incapable of being reliably used to form an electrical interconnection of copper conductors. In an interconnect application, to which the method of the present invention is aimed, if copper and tungsten were to be employed, it would be important that the contact between the tungsten and copper be low-resistance, that is, that it be metallurgically "good." Yet, it is well known that tungsten is insoluble in copper. Those persons skilled in the art know that copper-tungsten "alloys" are in actuality simply mixtures of the two metals prepared by allowing molten copper to seep into the pores of a tungsten material. This fact has impeded attempts to form good electrical interconnection between copper and tungsten at low temperatures. For example, Takashi Nagasaka and a number of colleagues were, as reported in T. Nagasaka, Y. Ootani, K. Ban, S. Konda, and T. Sonobe, "The Connection of a Copper Conductor with a Tungsten Conductor on an Alumina Multilayer Substrate", Proceedings of IMC, pp. 255-261 (1986), only able to achieve satisfactory contact between copper and tungsten after plating the copper on the tungsten and then firing the composite at 900° C. From the foregoing it is clear that a low temperature (i.e., <500° C.) process that forms satisfactory low-resistance, well-adhering contact between laser-deposited tungsten metal and prepatterned copper conductors is still needed. The requirement that the process be carried out at low temperatures is especially important since medium-film interconnect substrates can employ dielectrics with low decomposition temperatures, for instance polyimide.

For a full understanding of the prior art related to the present invention, certain attributes of nickel must also be discussed. Nickel is known to form a number of alloys with tungsten, which alloys are stable at low temperatures. J. S. Lee and several of his colleagues have investigated compacts formed by W-Cu, W-Ni, and W-Cu-Ni. The results of their investigation are reported in J. S. Lee, W. A. Kaysser, and G. Petzow, "Microstructural Changes in Tungsten-Copper and Tungsten-Copper-Nickel Compacts During Heating Up for Liquid Phase Sintering", Mod. Dev. Powder Metall., v. 15, pp. 489-506 (1985). Lee et al. showed that at temperatures between 700° C. and 900° C. W-Cu-Ni compacts behave qualitatively similar to W-Ni compacts. This may be contrasted with the behavior of W-Cu compacts alone, for which no wetting is observed below the melting point of copper, that is, 1080° C. In other words, the addition of nickel improves the wetability of copper on tungsten surfaces. Above 900° C., but below the melting point of copper, copper takes nickel into solid solution in W-Cu-Ni compacts, reducing the W-Ni interaction (wetting). In an extension of this work, reported in J. S. Lee and I. H. Moon, "Effect of Tungsten Particle Size on Infiltration Process and Microstructure in Nickel-Doped Tungsten-Copper Electric Contacts", Horiz. Powder Metall. Proc. Int. Powder Metall. Conf., Exhib. pp. 1115-18 (1986), Lee and another colleague reported that the addition of nickel also affects the resulting tungsten network structure.

From the bulk CVD process literature (not a laser-enhanced process, as per the teachings of the present invention), the work of Kamijima et al. warrants mention as "related" to the present invention. Kamijima et al.,s research is reported in A. Kamijima, S. Ito, H. Momotani and N. Yoneda, "Tungsten Coatings on Iron, Nickel, Copper and Stainless Steel Obtained by CVD Method", Journal of the Metal Finishing Society of Japan, V. 39, pp. 315-322 (1988) (in Japanese). Kamijima et al. have performed experiments in which tungsten was deposited from $WCl_6$ onto iron, nickel, copper, and stainless steel substrates. Despite their claims that tungsten adheres well on both nickel and copper, it is clear from SEM photographs of surface morphology in Kamijima et al.'s article that the tungsten covers the surface of the nickel in a much smoother, less porous manner. While porosity may not adversely affect adhesion, it might definitely affect electrical resistance—a less porous deposit is clearly more desirable. Kamijima et al. do not mention the electrical implications of porosity.

From the foregoing, several things may be understood by those persons skilled in the art. First, it is clear that copper-to-tungsten contacts are not as easy to form, and are probably not as reliable as nickel-to-copper or nickel-to-tungsten contacts, even if formed at high temperatures. Second, while there are hints in the literature as to the scientific basis underlying applicant's methodology, the present invention is neither disclosed nor suggested by the prior art teachings. The shortcomings Of the techniques suggested by the prior art are only likely to be aggravated at the temperatures of interest for laser CVD processing, that is, in the range of 300°–500° C.

SUMMARY OF THE INVENTION

The present invention provides a method for forming low-resistance electrical connections between copper conductors. These copper conductors could exist or be disposed on, for example, printed circuit boards or high-density multi-chip interconnection substrates. According to the teachings of the present invention these electrical connections are formed by using a focused laser beam to stimulate the decomposition of tungsten metal from gas phase precursors. Further according to the teachings of the present invention, the tungsten deposition is preceded by a coating of the surfaces of the copper conductors with a second metal layer, so that the tungsten will readily nucleate, adhere to, and cover with few pores, the copper conductors. Nickel is a preferred metal for forming the second layer.

BRIEF DESCRIPTION OF THE DRAWINGS

Other objects, advantages and novel features of the present invention will become apparent from the following detailed description of the invention when considered in conjunction with the accompanying drawings wherein.

DETAILED DESCRIPTION OF THE INVENTION

The large number of external electrical connections required on VLSI integrated circuits (IC's) demands very fine linewidths on each of the inter-chip interconnection paths. An emerging technology which addresses this need is the use of copper conductors on a polyimide inter-layer dielectric substrate.

Figure 1:
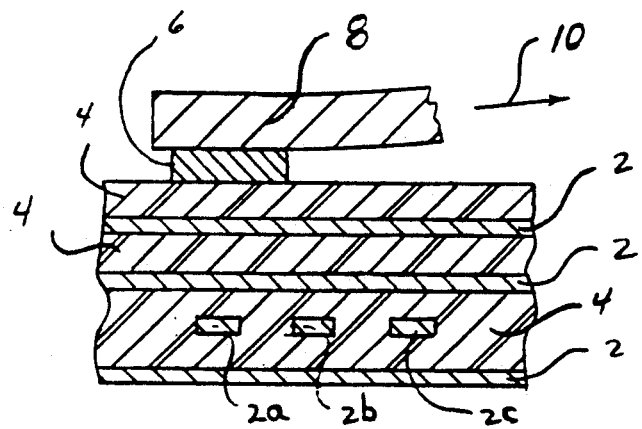
FIG. 1 is a cross-sectional view of a multi-layer interconnection module comprising copper conductors and polyimide inter-layer dielectric.

Referring now to FIG. 1, a schematic representation of this technology is shown therein. FIG. 1 is a cross-sectional view of a multi-layer interconnection module composed of copper conductors 2 and a polyimide inter-layer dielectric 4. The thickness of the conductors 2a–2c may be on the order of between 3 microns and 6 microns while both their widths and the distances to the underlying conductor 2 is on the order of between 8 microns and 30 microns. Reference numeral 6 designates a bond pad and reference numeral 8 designates a tape-automated-bond (TAB) lead. Arrow 10 indicates that the TAB lead would be connected to a chip I/0 pad during actual application.

As with integrated circuits, direct repair or customization of interconnect module conductors is most efficiently accomplished using laser techniques. Laser chemical vapor deposition (LCVD) is recognized by those skilled in the art as an attractive approach because of its versatility and linewidth resolution. LCVD of copper and nickel have been demonstrated, but neither process is optimal for this application because copper is susceptible to corrosion during subsequent processing steps and because $Ni(Co)_4$, the most common CVD precursor for nickel, is extremely toxic. Tungsten, on the other hand, is attractive because of its low resistivity, corrosion resistance, and simple deposition chemistry. As discussed in the Description of Related Art section above, while tungsten LCVD has previously been used with integrated circuits, it has not been employed with copper-on-polyimide interconnection modules (or "substrates").

As should be appreciated by those skilled in the art, LCVD of tungsten for copper-polyimide substrates presents new challenges compared to those associated with the production of aluminum-on-silicon dioxide IC's. First, the contact metallurgy is entirely different. Second, polyimide decomposes at a much lower temperature (about 500° C.) than silicon dioxide, so that the substrate surface cannot be heated to as high a temperature. This impedes obtaining high tungsten deposition rates. A major objective of the research that led to the present invention was to achieve selectivity loss at high reactant compositions or localized substrate temperatures; that is, it was desired to deposit tungsten directly on polyimide, without requiring tungsten nearby in order to initiate the process.

In experiments that led to the method and system of the present invention, copper-polyimide samples were fabricated by means of patterned electroplating and mechanical polish planarization processes. Beginning with a 10-centimeter oxidized silicon wafer, Dupont 2525 polyimide was spun on, dried, cured, and polished to a thickness of about 18 microns. A 5-micron thick layer of copper was formed by electroplating through a patterned layer of photoresist, over sputtered layers of chromium and copper. Finally, after removing the photoresist and stripping the Cu and Cr layers, a thin layer of nickel was formed on the exposed surfaces of the copper lines. The purpose of this nickel layer was to protect the surface of the copper during subsequent processing steps. Prior to LCVD experiments, the wafers were diced into approximately 3-centimeters ×3-centimeters square pieces for individualized processing.

Figure 2:
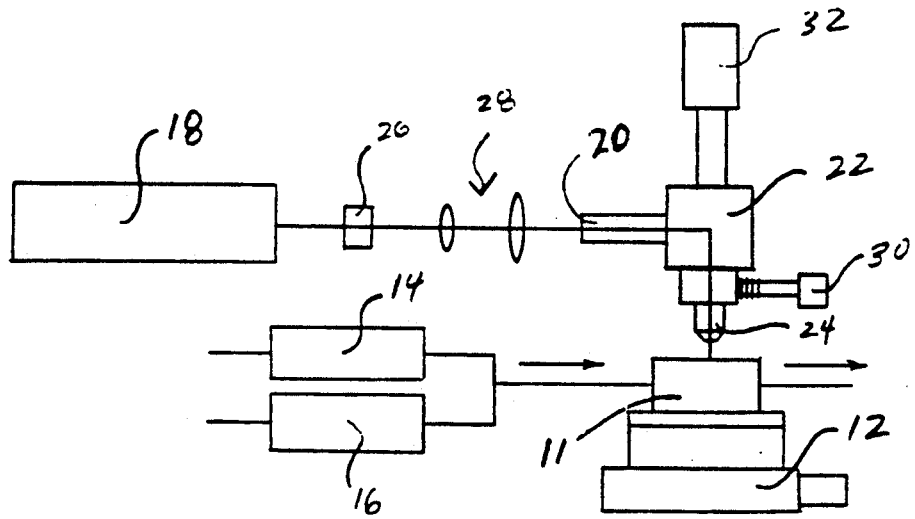
FIG. 2 is a block diagram of a laser microscope system such as could be employed to execute the method according to the present invention.

Referring now to FIG. 2, a block diagram illustrating the key components of a laser microscope system is shown therein. Although details regarding the system of FIG. 2 are set forth herein, these details are only for convenience in understanding one means for executing the method of the present invention and the invention should in no way be construed to be limited to the specific details of the particular implantation system shown in FIG. 2. The laser microscope system shown in FIG. 2 comprises a sample chamber 11 mounted upon a computer-controlled X-Y translation stage 12, a hydrogen mass flow controller 14, a tungsten hexafluoride mass flow controller 16, a CW Argon Ion laser 18, and a modified microscope 22. The modified microscope 22 has a port 20, an illuminator 30, a 20X objective 24 and an attached television camera 32. The output power of the CW Argon Ion laser is controllable by conventional means. A mechanical shutter 26 and a beam expander 28 between the CW Argon Ion laser 18 and the modified microscope 22 are disposed.

In the experiments which lead to the method and system of the present invention, a prepared copper-polyimide sample was placed inside the stainless steel reaction chamber 11 mounted upon the computer-controlled X and Y translation stages 12. After evacuating chamber 11, $H_2$ and $WF_6$ gases were introduced at controlled rates into the chamber 11 via mass controllers 14 and 16. The all-lines, $TEM_{\infty}$ output of the CW Argon Ion laser beam (whose dominant lines were at 514 and 488 nm) was first expanded, then directed into the port 20 of the modified microscope 22. The beam was finally focused by means of the 20X microscope objective 24 through a glass window in the reaction chamber 11 to a spot size on the order of 20 microns at the sample surface. The precise location of the tungsten deposit was controlled by manipulating the translation stages of platform 12 to position the sample within the chamber 11 at the desired location underneath the focused laser beam. Furthermore, the tungsten was deposited on the polyimide without nearby tungsten initiating the deposition. The time interval during which the laser beam was exposed to the sample was controlled by means of a computer-controlled mechanical shutter 26. The polyimide, which decomposes above 500° C., was not significantly damaged by the laser beam.

Based upon the foregoing, the method according to the present invention can be stated to consist of the following steps:

1. coating the copper conductors of an interconnect substrate (e.g., a polyimide-coated silicon wafer) with a thin layer of a first electrical conductor metal, which serves as a interfacial layer aiding the adhesion and reliability of the connection, and which readily alloys with a second electrical conductor metal;

2. exposing the substrate containing the coated copper conductors to a gas mixture which includes the second electrical conductor metal; and 3. irradiating those portions of the substrate with a laser beam focused upon the location on the substrate where it is desired that the second conductor metal be deposited, so that the second electrical conductor forms the greater part of the connection between the copper conductors.

Recognizing that manipulating the translation stages to position the sample at the desired location underneath the focused laser beam can be characterized as a laser "scan", the irradiation step mentioned above involves scanning the beam relative to the substrate, going in sequence from one metalcoated copper conductor to another over intervening regions of dielectric material (e.g., polyimide, silicon dioxide, or epoxy). Furthermore, two laser scans may be prefered to assure that the laser power is kept low enough to prevent significant ablation of the polyimide yet high enough so that sufficient tungsten is deposited on the nickel-copper to form a low resistance contact. Deposition of metal from the gas phase takes place where the laser beam is focused due to selective-area stimulation of a chemical vapor deposition (CVD) process. The presence of the first metal, e.g., nickel, on the copper conductor, stimulates the nucleation, adhesion, and surface coverage of the tungsten metal over the composite structure. It is recognized that in cases in which the deposition occurs over materials with widely varying thermal conductivities (such as copper and polyimide), it may be necessary to dramatically alter the power output from laser in traversing such regions, so that a more nearly isothermal surface can be more readily maintained.

Figure 3:
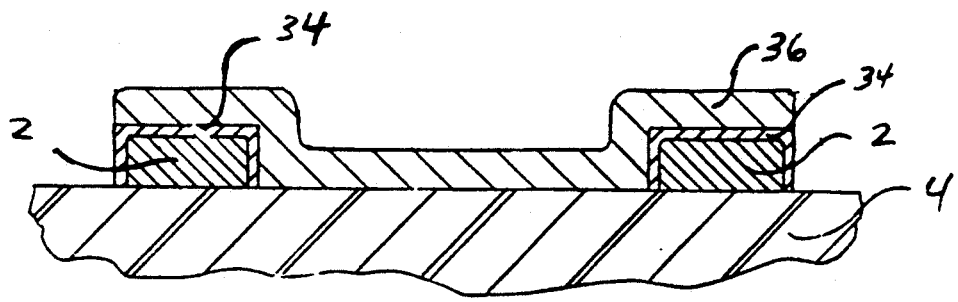
FIG. 3 is a cross-sectional view of a completed electrical connection made by the present invention.

Referring now to FIG. 3, a cross-sectional view is shown of a connection made according to the teachings of the present invention. Two copper conductors 2 are shown in FIG. 3 as being disposed on a layer of polyimide 4. Thin layers of nickel 34, for instance 0.2 to 1 microns thick, are disposed over both of the conductors 2, and a tungsten connection 36 is made between the two conductors 2. Preferably the nickel layer should maintain the same proportional thickness if different thicknesses of copper layers are used, i.e., in the range of 4% to 20% of the copper thickness.

In the practice of the present invention, nickel is the presently preferred first metal, and has been successfully reduced to practice. In addition to nickel's desirable reactivity with copper and tungsten, there are straightforward and inexpensive methods of coating copper surfaces with nickel well known to those skilled in the art. Electroplating and electroless plating processes are preferred manners in which nickel is applied to the surface of the copper. It should also be recognized that there are other metals in addition to nickel; such as chromium, molybdenum, scandium, titanium, and vanadium; which can also be used in execution of the method of the present invention.

Further, according to the teachings of the present invention, the preferred gas mixture is one containing $WF_6$ and either $H_2$, $SiH_4$, or $H_2$ and $SiH_4$. Other tungsten bearing compounds could also be used. Examples of these would include $W(CO)_6$ or $WCl_6$. Although not necessary to allow the chemical process to proceed, it is recognized that it may be advantageous under some circumstances to include an inert buffer gas, such as argon, in the gas mixture.

Still further according to the teachings of the present invention, a visible wavelength CW Argon Ion laser is the preferred laser, but other lasers such as a CW frequency-doubled Nd:YAG laser, a CW Krypton laser, or a CW dye laser, could also be used.

Further details regarding one example of how the process according to the present invention has been carried out may be found in R. Miracky, "The Application of Selective-Area Tungsten Laser CVD to Copper-On-Polyimide Multi-Chip Interconnection Modules", Materials Research Society publication, pp. 299-305 (1989). The details set forth in that article are hereby incorporated into this application by reference.

The method according to the present invention is useful for a number of reasons. First, the method can be used to repair or customize copper interconnects and microelectronic circuits without requiring conventional photolithography steps. Second, tungsten CVD is a widely used and well understood chemistry by which metal can be deposited onto a variety of substrates. Third, tungsten laser CVD is a gas phase process, thus expanding its applicability. For example, tungsten laser CVD can be used after chips have been attached to hybrid modules. Fourth, the method according to the present invention can be used with copper interconnects, the most widely used type of inter-chip interconnections.

It is believed that the operation and construction of the present invention will be apparent from the foregoing description. While the methods and apparatus shown and described have been characterized as being preferred, it will be obvious that various changes and modifications may be made therein without departing from the spirit and scope of the invention.

What is claimed is:

1. A method for forming an electrical interconnection between copper conductors disposed on a dielectric substrate, comprising the steps of:

coating said copper conductors with an electrically conductive metal that readily alloys with tungsten;
exposing said substrate to a gas which includes tungsten; and irradiating selected regions of said substrate with a laser beam so that said tungsten is deposited on and alloyed to said metal coating on each copper conductor and said tungsten is also deposited on said dielectric, thereby forming a well-adhering electrical interconnection between said copper conductors without raising the local temperature of said irradiated regions above 600° C.

2. A method as recited in claim 1, wherein said metal is a metal selected from the group consisting of nickel, chromium, molybdenum, scandium, titanium, and vanadium.

3. A method as recited in claim 2, wherein said metal is nickel.

4. A method as recited in claim 1, wherein said copper conductors are disposed on a printed circuit board.

5. A method as recited in claim 1, wherein said copper conductors are disposed of an interconnecting substrate.

6. A method as recited in claim 5, wherein said interconnection substrate is a high-density multi-chip polyimide interconnection substrate.

7. A method as recited in claim 1, wherein said copper conductors are coated with a layer of said metal that is from about 0.2 micron to about 1.0 micron thick.

8. A method as recited in claim 7, wherein said layer of metal is applied by electroplating.

9. A method as recited in claim 7, wherein said layer of metal is applied by an electroless plating process.

10. A method as recited in claim 1, wherein said step of irradiating said substrate comprises the steps of scanning said laser beams relative to said substrate.

11. A method as recited in claim 10, wherein during said scanning, said laser beam is passed without interruption from one coated copper conductor to another.

12. A method as recited in claim 11, wherein said irradiation is effected by a laser having a controllable output, and wherein said laser output is altered during said laser beam passing operation.

13. A method as recited in claim 1, wherein said dielectric is selected from the group consisting of polyimide, silicon dioxide and epoxy.

14. A method as recited in claim 1, wherein said dielectric decomposes above 500° C. is not significantly damaged by said laser beam.

15. A method as recited in claim 1, wherein said coatings of metal have a thickness in the range from about 4% to about 20% of the thickness of said copper conductors coated thereby.

16. A method as recited in claim 1, wherein said tungsten is deposited directly on said substrate without tungsten initiating said deposition.

17. A method as recited in claim 1, wherein said local temperatures is not raised above 500° C.

18. A method as recited in claim 17, wherein said local temperature is raised above 300°C. but not above 500°C.

19. A method as recited in claim 1, wherein
said laser beam is scanned a first pass from one metal coated conductor to another without interruption, and then
said laser beam is scanned a second pass from said one metal coated conductor to said another without interruption.

20. A method involving temperatures less than 500° C. for forming a well-adhering electrical connection between a pair of copper conductors disposed on a dielectric, comprising the steps of:
coating said copper conductors with nickel; and
depositing tungsten between said copper conductors and over the nickel coating of both of said copper conductors by applying irradiation to form a tungsten-nickel alloy on the copper conductors and a tungsten interconnection therebetween.

21. A method as recited in claim 20, wherein said nickel coating is from about 0.2 micron to about 1.0 micron thick.

22. A method as recited in claim 19, wherein said deposition of tungsten is effected by a chemical vapor deposition process.

23. A method as recited in claim 22, wherein said chemical vapor deposition process is effected by means of a visible wavelength laser.

24. A method as recited in claim 23 wherein said chemical vapor deposition process includes a gas containing $WF_6$.

25. A method as recited in claim 24 wherein said chemical vapor deposition process wherein said gas further contains $H_2$, $SiH_4$, or a combination thereof.

26. A method for forming an electrical interconnection between a pair copper conductors disposed on a high-density multi-chip polyimide interconnect substrate, comprising the steps of:
coating said copper conductors with nickel wherein the thickness of said nickel coatings is between 4% to 20% of the thickness of said copper conductors;
exposing said substrate to a gas which includes tungsten; and
irradiating selected regions of said substrate by scanning a laser beam without interruption from one coated copper conductor to the other so that by chemical vapor deposition said tungsten is deposited on and alloyed to said nickel coating on each copper conductor and said tungsten is also deposited on said polyimide to form a continuous well-adhering electrical interconnection between said copper conductors without raising the local temperature of said irradiated regions above 500°C., without significantly damaging said polyimide and without nearby tungsten initiating said tungsten deposition on said polyimide or on said nickel.

* * * * *